United States Patent
Thothadri et al.

(10) Patent No.: US 12,176,384 B2
(45) Date of Patent: Dec. 24, 2024

(54) METHODS OF PARALLEL TRANSFER OF MICRO-DEVICES USING TREATMENT

(71) Applicant: Applied Materials, Inc., Santa Clara, CA (US)

(72) Inventors: Manivannan Thothadri, Mountain View, CA (US); Arvinder Chadha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/450,963

(22) Filed: Aug. 16, 2023

(65) Prior Publication Data

US 2023/0395645 A1 Dec. 7, 2023

Related U.S. Application Data

(60) Division of application No. 17/479,985, filed on Sep. 20, 2021, now Pat. No. 11,776,989, which is a
(Continued)

(51) Int. Cl.
*H01L 27/15* (2006.01)
*H01L 21/67* (2006.01)
(Continued)

(52) U.S. Cl.
CPC ...... *H01L 27/156* (2013.01); *H01L 21/67144* (2013.01); *H01L 21/6835* (2013.01);
(Continued)

(58) Field of Classification Search
None
See application file for complete search history.

(56) References Cited

U.S. PATENT DOCUMENTS 6,961,993 B2 11/2005 Oohata
7,744,770 B2 6/2010 Doi et al.
(Continued)

FOREIGN PATENT DOCUMENTS

JP H08-021977 1/1996
JP 2001-305664 11/2001
(Continued)

OTHER PUBLICATIONS

International Search Report and Written Opinion in International Appln. No. PCT/US2022/076071, mailed on Jan. 2, 2023, 8 pages.
(Continued)

*Primary Examiner* — Jack S Chen
(74) *Attorney, Agent, or Firm* — Fish & Richardson P.C.

(57) ABSTRACT

A method of transferring micro-devices includes selectively treating a first adhesive layer to form a treated portion and an untreated portion while micro-devices are attached the first adhesive layer. A second adhesive layer on a second surface is placed to abut the micro-devices. The first adhesive layer is exposed to illumination in a region that overlaps at least some of the treated portion and at least some of the untreated portion. Exposing the first adhesive layer to illumination neutralizes the at least some of the untreated portion to create a neutralized portion that is less adhesive than an exposed area of the treated portion. The first surface is separated from the second surface such that micro-devices in the treated portion remain attached to the first surface and micro-devices in the neutralized portion are attached to the second surface and separate from the first surface.

8 Claims, 13 Drawing Sheets

Related U.S. Application Data continuation-in-part of application No. 16/805,378, filed on Feb. 28, 2020, now Pat. No. 11,127,781, which is a division of application No. 16/270,235, filed on Feb. 7, 2019, now Pat. No. 10,580,826, which is a division of application No. 15/619,226, filed on Jun. 9, 2017, now Pat. No. 10,217,793.

(60) Provisional application No. 62/348,691, filed on Jun. 10, 2016.

(51) Int. Cl.
*H01L 21/683* (2006.01)
*H01L 25/075* (2006.01)
*H01L 33/00* (2010.01)
*H01L 33/60* (2010.01)
*H05K 3/00* (2006.01)
*H05K 3/30* (2006.01)
*H05K 13/00* (2006.01)
*H05K 13/04* (2006.01)
*H01L 33/20* (2010.01)
*H01L 33/48* (2010.01)

(52) U.S. Cl.
CPC ...... *H01L 25/0753* (2013.01); *H01L 33/0095* (2013.01); *H01L 33/60* (2013.01); *H05K 3/0026* (2013.01); *H05K 3/305* (2013.01); *H05K 13/0015* (2013.01); *H05K 13/0069* (2013.01); *H05K 13/0469* (2013.01); *H01L 33/20* (2013.01); *H01L 33/48* (2013.01); *H01L 2221/68322* (2013.01); *H01L 2221/68368* (2013.01); *H01L 2221/68381* (2013.01); *H01L 2933/0033* (2013.01)

(56) References Cited

U.S. PATENT DOCUMENTS

| | | | |
|---|---|---|---|
| 8,361,268 | B2 | 1/2013 | Mizuno et al. |
| 8,476,826 | B2 | 7/2013 | Oohata et al. |
| 9,331,230 | B2 | 5/2016 | Shieh et al. |
| 9,401,298 | B2 | 7/2016 | Zakel et al. |
| 9,554,484 | B2 | 1/2017 | Rogers et al. |
| 9,862,141 | B2 | 1/2018 | Marinov et al. |
| 10,153,325 | B2 * | 12/2018 | Thothadri ........... H01L 21/6835 |
| 10,985,143 | B2 | 4/2021 | Bower et al. |
| 2002/0064032 | A1 | 5/2002 | Oohata |
| 2006/0007297 | A1 | 1/2006 | Doi et al. |
| 2007/0103664 | A1 | 5/2007 | Chiu |
| 2008/0122119 | A1 | 5/2008 | Kian et al. |
| 2008/0210368 | A1 | 9/2008 | Zakel et al. |
| 2010/0044596 | A1 | 2/2010 | Ishikawa et al. |
| 2010/0123268 | A1 | 5/2010 | Menard |
| 2010/0258543 | A1 | 10/2010 | Mizuno et al. |
| 2010/0259164 | A1 | 10/2010 | Oohata et al. |
| 2012/0025182 | A1 | 2/2012 | Umeda et al. |
| 2013/0130440 | A1 | 5/2013 | Hu et al. |
| 2014/0120640 | A1 | 5/2014 | Shieh et al. |
| 2014/0238592 | A1 | 8/2014 | Marinov et al. |
| 2016/0124316 | A1 | 5/2016 | Markle et al. |
| 2016/0219684 | A1 | 7/2016 | Kaskey et al. |
| 2016/0282728 | A1 | 9/2016 | Johnston et al. |
| 2017/0338199 | A1 | 11/2017 | Zou et al. |
| 2019/0096859 | A1 | 3/2019 | Zou |
| 2019/0103439 | A1 | 4/2019 | Thothadri |
| 2020/0313035 | A1 | 10/2020 | Lee et al. |
| 2020/0357951 | A1 | 11/2020 | Park et al. |
| 2022/0254673 | A1 | 8/2022 | Min et al. |

FOREIGN PATENT DOCUMENTS

| | | |
|---|---|---|
| JP | 2003-005100 | 1/2003 |
| JP | 2004-299814 | 10/2004 |
| JP | 2005-175264 | 6/2005 |
| JP | 2006-173215 | 6/2006 |
| JP | 2007-025085 | 2/2007 |
| JP | 2008-122681 | 5/2008 |
| JP | 2010-014797 | 1/2010 |
| KR | 10-2218988 | 2/2021 |
| TW | 201113940 | 4/2011 |
| TW | 201611235 | 3/2016 |
| WO | WO 2010132552 | 11/2010 |
| WO | WO 2013010113 | 1/2013 |
| WO | WO 2014074954 | 5/2014 |
| WO | WO 2020103365 | 5/2020 |

OTHER PUBLICATIONS

Terecircuits.com [online], "Terecircuits," 2015, retrieved on Sep. 6, 2017, retrieved from URL <terecircuits.com/photoprinting.shtml>, 2 pages.

* cited by examiner

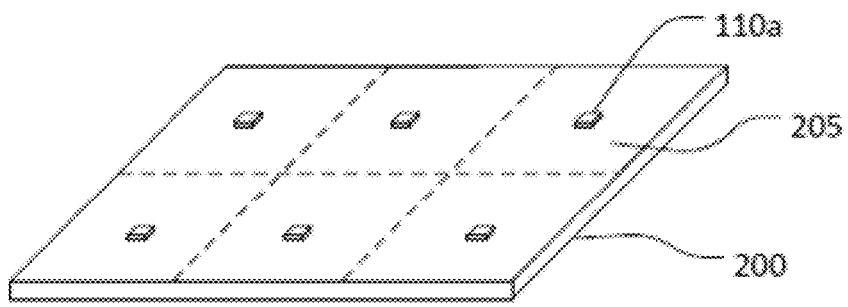
FIG. 14
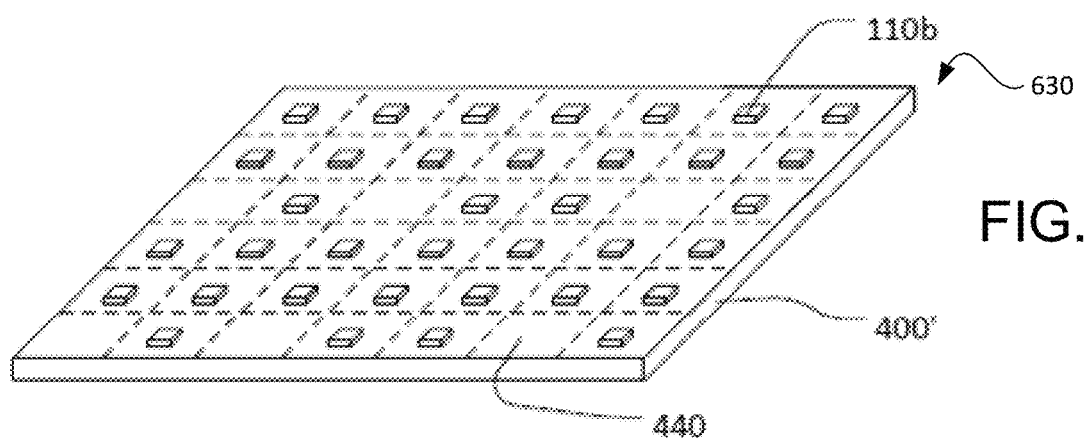
FIG. 15
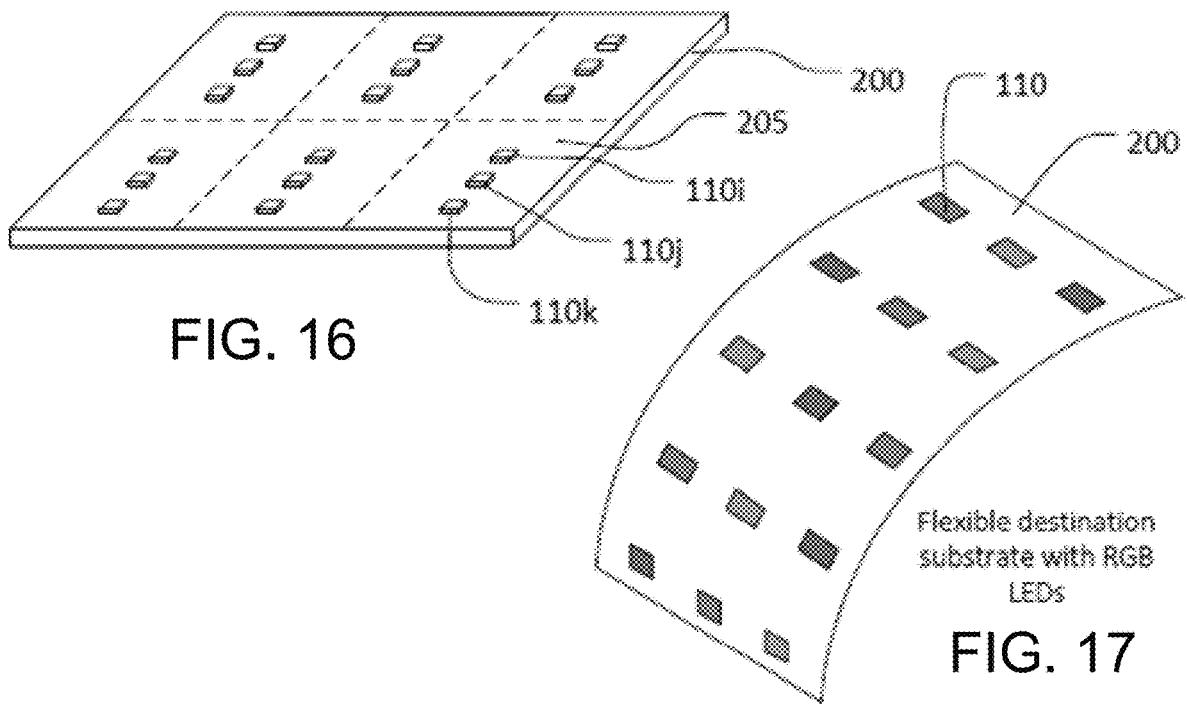
FIG. 16
FIG. 17

METHODS OF PARALLEL TRANSFER OF MICRO-DEVICES USING TREATMENT

CROSS-REFERENCE TO RELATED APPLICATIONS

This application is divisional of U.S. application Ser. No. 17/479,985, filed Sep. 20, 2021, which is a continuation-in-part of U.S. application Ser. No. 16/805,378, filed Feb. 28, 2020, which is a divisional of U.S. application Ser. No. 16/270,235, filed Feb. 7, 2019, which is a divisional of U.S. application Ser. No. 15/919,226, filed Jun. 9, 2017, which claims priority to U.S. Provisional Application Ser. No. 62/348,691, filed on Jun. 10, 2016, the disclosures of which are incorporated by reference.

TECHNICAL FIELD

This disclosure generally relates to the transfer of micro-devices from a donor substrate to a destination substrate.

BACKGROUND

A wide variety of products include an array of individual devices on a substrate, with the devices addressable or controllable by circuitry on the substrate. Where the individual devices are on the micron scale, e.g., less than 100 microns across, the devices can be considered micro-devices. In general, micro-devices can be fabricated using a sequence of microfabrication techniques, such as deposition, lithography and etching, to deposit and pattern a sequence of layers.

One approach for fabricating a device that includes an array of individual micro-devices is to directly fabricate the individual micro-devices on the substrate which will form part of the product. This technique has been used, e.g., to fabricate the TFT panel and color filter panels of an active matrix liquid crystal display (LCD).

One proposed display panel technology uses an array of LEDs, with individual LEDs providing the individually controllable pixel elements. Such an LED panel can be used for a computer, touch panel device, personal digital assistant (PDA), cell phone, television monitor, and the like.

Although organic light-emitting diode (OLED) panels are in use, an LED panel that uses micron-scale LEDs based on III-V semiconductor technology (also called microLEDs) faces additional problems. In particular, depositing and growing III-V semiconductor microLEDs directly on a final display substrate poses technical and manufacturing hurdles. Moreover, microLED panels are difficult to manufacture in curved or bendable display.

SUMMARY

The present disclosure generally relates to systems and methods for surface mounting micro-devices over a large area.

In one aspect, a method of transferring micro-devices includes selectively treating a first adhesive layer to form a treated portion of the adhesive layer and an untreated portion of the first adhesive layer while a plurality of micro-devices are attached to a first surface of a first body by the first adhesive layer. The treated portion corresponding to one or more micro-devices from the plurality of micro-devices. While the plurality of micro-devices are attached to the first surface by the first adhesive layer, a second surface of a second body is positioned relative to the first surface so that a second adhesive layer on the second surface abuts the plurality of micro-devices on a side of plurality of micro-devices opposite the first surface. The first adhesive layer is exposed to illumination in a region that overlaps at least some of the treated portion and at least some of the untreated portion, and exposing the first adhesive layer to illumination neutralizes the at least some of the untreated portion to create a neutralized portion that is less adhesive than an exposed area of the treated portion. The first surface is separated from the second surface such that one or more micro-devices corresponding to the treated portion of the first adhesive layer remain attached to the first surface and one or more micro-devices corresponding to the neutralized portion are attached to the second surface and are separated from the first surface.

In another aspect, a method of transferring micro-devices includes selectively treating a first adhesive layer to form a treated portion of the first adhesive layer that extends partially but not entirely through first adhesive layer and an untreated portion of the first adhesive layer while a plurality of micro-devices are attached to a first surface of a first body by the first adhesive layer. The selectively treating causes the treated portion to have a higher opacity to light of a first wavelength than the untreated portion. While the plurality of micro-devices are attached to the first surface by the first adhesive layer, a second surface of a second body is positioned relative to the first surface so that a second adhesive layer on the second surface abuts the plurality of micro-devices on a side of plurality of micro-devices opposite the first surface. The first adhesive layer is exposed to illumination of the first wavelength in a region that overlaps at least some of the treated portion and at least some of the untreated portion, and exposing the first adhesive layer to illumination neutralizes the at least some of the untreated portion to create a neutralized portion while the treated portion blocks the illumination from reaching at least some of the untreated portion such to provide a less exposed portion of the first adhesive layer that is more adhesive than the neutralized portion. The first surface is separated from the second surface such that one or more micro-devices corresponding to the treated portion of the first adhesive layer remain attached to the first surface and one or more micro-devices corresponding to the neutralized portion are attached to the second surface and are separated from the first surface.

In another aspect, an apparatus for transferring micro-devices includes a first body having a first surface to receive a first adhesive layer, a second body having a second surface to receive a second adhesive layer, one or more actuators configured to provide relative motion between the first body and the second body, a first illumination system configured to selectively expose the first adhesive layer to a light having a first wavelength, a second illumination system configured to expose the first adhesive layer to a light having a different second wavelength, and a controller configured to perform the operations necessary to carry out the process discussed above.

In another aspect, a method of transferring micro-devices includes attaching a plurality of micro-devices to a first surface of a first body with a first adhesive layer, and selectively forming a masking layer on a second surface of the first body on a side of the first body opposite the first surface. While the plurality of micro-devices are attached to the first surface by the first adhesive layer, a third surface of a second body is positioned relative to the first surface so that a second adhesive layer on the third surface abuts the plurality of micro-devices on a side of plurality of microdevices opposite the first surface. The first adhesive layer is exposed to illumination through the first body to create a neutralized portion while the masking layer blocks the illumination from reaching at least some of first adhesive layer to provide a less exposed portion of the first adhesive layer that is more adhesive than the neutralized portion. The first surface is separated from the second surface such that one or more micro-devices corresponding to the less exposed portion of the first adhesive layer remain attached to the first surface and one or more micro-devices corresponding to the neutralized portion are attached to the third surface and are separated from the first surface.

Implementations can optionally provide (and are not limited to) one or more of the following advantages. The micro-devices on the donor substrate can be built at a higher spatial density than desired for the destination substrate, thereby increasing throughput and saving wafer space when budding the micro-devices. A large number of micro-devices can be transferred in parallel from the donor substrate to the destination substrate. The transfer can be performed with high precision. Thus, yield can be increased and manufacturing time and cost can be reduced. Defective micro-devices on the donor substrate can be identified and excluded from the transfer. If micro-devices are arranged on the destination substrate at a different pitch than the donor substrate, then the number of transfer steps can be reduced relative to prior techniques.

If the micro-devices are micro-LEDs, then the technique can be used to manufacture multi-color displays, such as displays with three or more color subpixels. Flexible and/or stretchable displays can be fabricated more easily.

Other aspects, features, and advantages will be apparent from the description and drawings, and from the claims.

A variety of implementations are described below. It is contemplated that elements and features of one implementation may be beneficially incorporated in other implementations without further recitation.

BRIEF DESCRIPTION OF THE DRAWINGS

FIG. 14 is a schematic perspective view of a destination substrate having an array of micro-devices mounted thereon.

FIG. 15 is a schematic perspective view of a transfer device after some of the micro-devices have been transferred.

FIG. 16 is a schematic perspective view of a destination substrate having multiple micro-devices per cell.

FIG. 17 is a schematic perspective view of a flexible substrate on which micro-LEDs have been mounted.

Like reference symbols in the various drawings indicate like elements.

DETAILED DESCRIPTION

Figure 1:
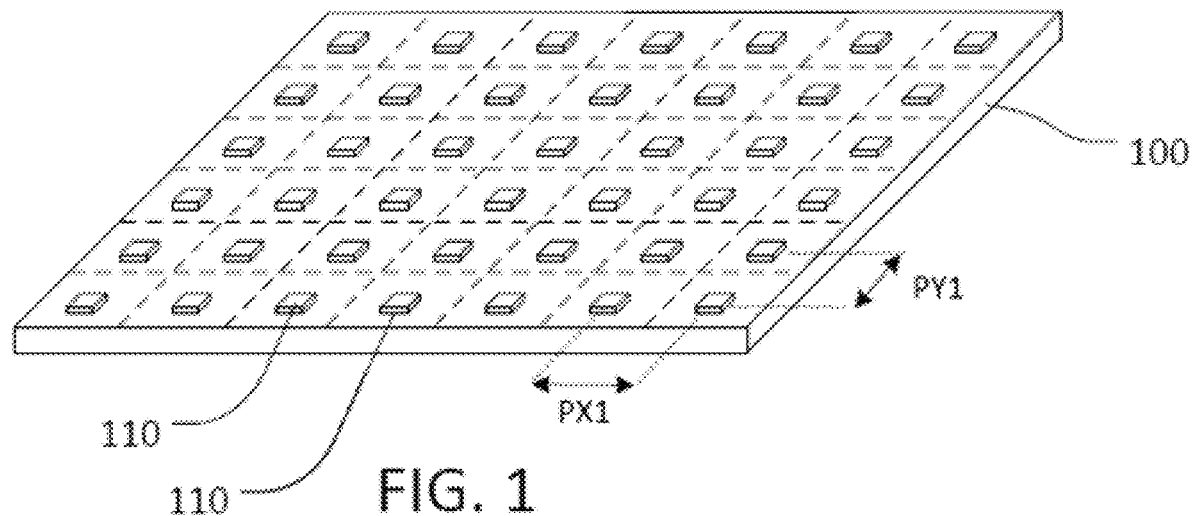
FIG. 1 is a schematic perspective view of a donor substrate with an array of micro-devices.

In order to manufacture some devices, new techniques are needed to precisely and cost-effectively provide micro-devices on substrates, such as large area substrates or flexible substrates. For example, it would be desirable to provide an LED panel based on III-V semiconductor technology, since microLEDs have significant brightness, lifetime and efficiency advantages over organic light-emitting diode (OLED) devices.

An approach for fabricating a device that includes an array of individual micro-devices is to fabricate the micro-devices en masse on an initial substrate, and then transfer the micro-devices to the receiving or destination substrate which will form part of the product. One reason to build the micro-devices on an initial substrate is that the destination substrate may be a material that is not compatible with the fabrication processes, e.g., etching and deposition, needed to form the micro-devices. For example, in the case of LEDs, deposition of the LED is an epitaxial growth process in which single crystalline gallium nitride (GaN) films are grown on sapphire wafers (sapphire wafers are used primarily due to the small lattice mismatch for GaN growth compared to other wafer materials). Another reason to build the micro-devices on initial substrate is that the micro-devices can be fabricated at higher spatial density than needed for the destination substrate, thereby increasing throughput and saving wafer real estate when building the micro-devices and consequently lowering cost.

One technique to transfer the micro-devices from the initial substrate to the destination substrate is a pick-and-place machine, e.g., a robot that transfers one micro-device at a time. However, this approach is not production worthy since it suffers from low throughput, particularly in view of the large number of micro-devices that would need to be transferred.

As the foregoing illustrates, there is a need for an improved method for manufacturing micro devices. As described below, a method for surface mounting micro-devices over a large area is disclosed. The method includes placing transfer substrate with an adhesive layer over the micro-devices on a donor substrate, adhering the adhesive layer to the micro-devices, removing the micro-devices from the donor substrate while they are adhered to the adhesive layer, aligning the micro-devices to a target locations on a destination substrate, placing the micro-devices, exposing the transfer substrate to a light source to separate the micro-devices from the transfer substrate, and moving the transfer substrate away from the micro-devices while the micro-devices remain on the transfer substrate. Micro-devices utilizing this method may be transferred to a polymer photolayer, and then transferred to the destination substrate using maskless lithography in a multitude of patterns and may be transferred to a wide variety of substrates.

Moreover, the micro-devices can be selectively released from the adhesive layer using a maskless lithography techniques. In contrast to a masked projection of light onto the adhesive layer, a maskless technique is adaptable to different release patterns, has a lower cost because it is not necessary to make a new mask for each release strategy, and is faster because time to fabricate the mask is not required.

FIG. 1 illustrates a donor substrate 100 with an array of micro-devices 110. The micro-devices 110 are small electronic elements, e.g., light-emitting diodes (LEDs), and integrated circuit chips such as logic ICs, processors, memory, controllers, etc. The micro-devices 110 are micron-scale devices, e.g., with a maximum lateral dimension of about 1 to 100 microns. For example, the devices can have a lateral dimension of about 1-50 microns, e.g., 5-50 microns, e.g., 10-30 microns. The micro-devices 110 can be identical, i.e., same dimensions, circuit pattern and layer structure.

Although FIG. 1 illustrates the micro-devices 110 in a regular rectangular array with pitch PX1 and PY1 in the two perpendicular directions parallel to the face of the donor substrate, other array configurations are possible, e.g., staggered rows.

The micro-devices 110 can be fabricated directly on the donor substrate 100. Alternatively, the micro-devices 110 could have been fabricated on another substrate, e.g., a device substrate and then transferred to the donor substrate 100. For example, the device substrate can include a wafer, e.g., a sapphire wafer, on which the micro-devices are fabricated, e.g., at relatively high density compared to the destination substrate. In some implementations, the micro-devices are transferred from the device substrate to the donor substrate without changing their pitch.

As one example for transferring the micro-devices, the micro-devices can be fabricated on the device substrate, and the donor substrate 100 can include or be an adhesive tape that is placed in contact with the devices. Then the device substrate can be removed or singulated so that each micro-device 110 is individually attached to the donor substrate, e.g., the tape.

As another example, the donor substrate 100 can include an adhesive layer 112 (see FIG. 4) that is placed in contact with the micro-devices 110 on the device substrate. Then a lift-off technique can be used to detach the micro-devices from the device substrate. For example, in a laser lift-off technique a laser beam, e.g., a UV laser beam, is directed at the back side of the substrate. The laser beam passes through the wafer to ablate material at the interface of the micro-devices and the wafer. When the donor substrate is moved away, the micro-devices are adhered to the donor substrate by the adhesive thus lifted away from the device substrate. In some implementations the adhesive layer is a UV-sensitive adhesive that becomes non-adhesive (aka "neutralized") when exposed to UV light.

Figure 2:
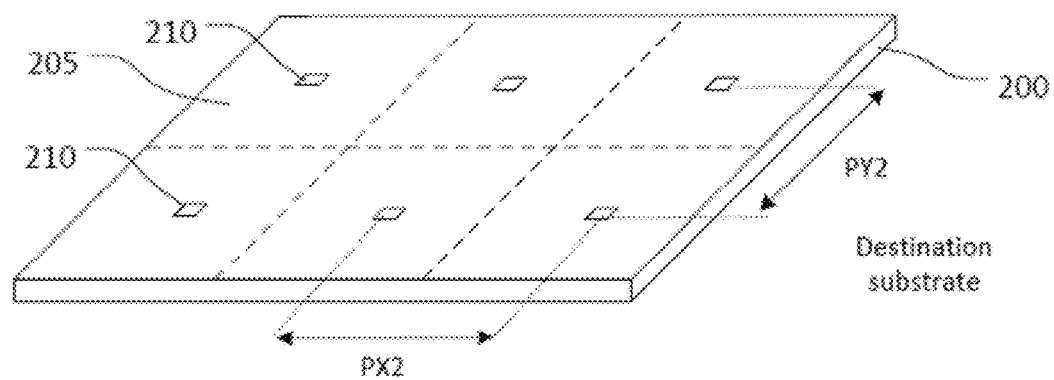
FIG. 2 is a schematic perspective view of a destination substrate.

FIG. 2 illustrates a destination substrate 200 with an array of cells 205, each of which has a spot 210 to receive a micro-device 110. Thus, the spots 210 are also arranged in an array. However, the spacing of the array of spots 210 on the destination substrate 200 can differ from the spacing of the micro-devices 110 on the donor substrate 100. Typically, the spacing between the spots 210 is larger than the spacing between the micro-devices 110 on the donor substrate 100. For example, FIG. 2 illustrates the spots 210 in a rectangular array with pitch PX2 and PY2 in the two perpendicular directions parallel to the face of the destination substrate 200. Thus, the pitch PX2 can be greater than the pitch PX1 and the pitch PY2 can be greater than the pitch PY1. As noted above, other array configurations are possible, e.g., staggered rows. Since the spacing between the spots 210 differs from the spacing between the micro-devices 110, the donor substrate 100 cannot simply be placed abutting the destination substrate 200 to transfer the micro-devices en masse.

Although not illustrated in FIG. 2, the destination substrate 100, particularly if it is the substrate that will form part of the product, can include circuitry and other components for delivering power to and/or addressing and/or controlling the micro-devices 110 when correctly secured in the spot 210. For example, each spot 210 can include one or more bond pads which will electrically connect to one or more bond pads on the micro-device 110.

Figure 13A:
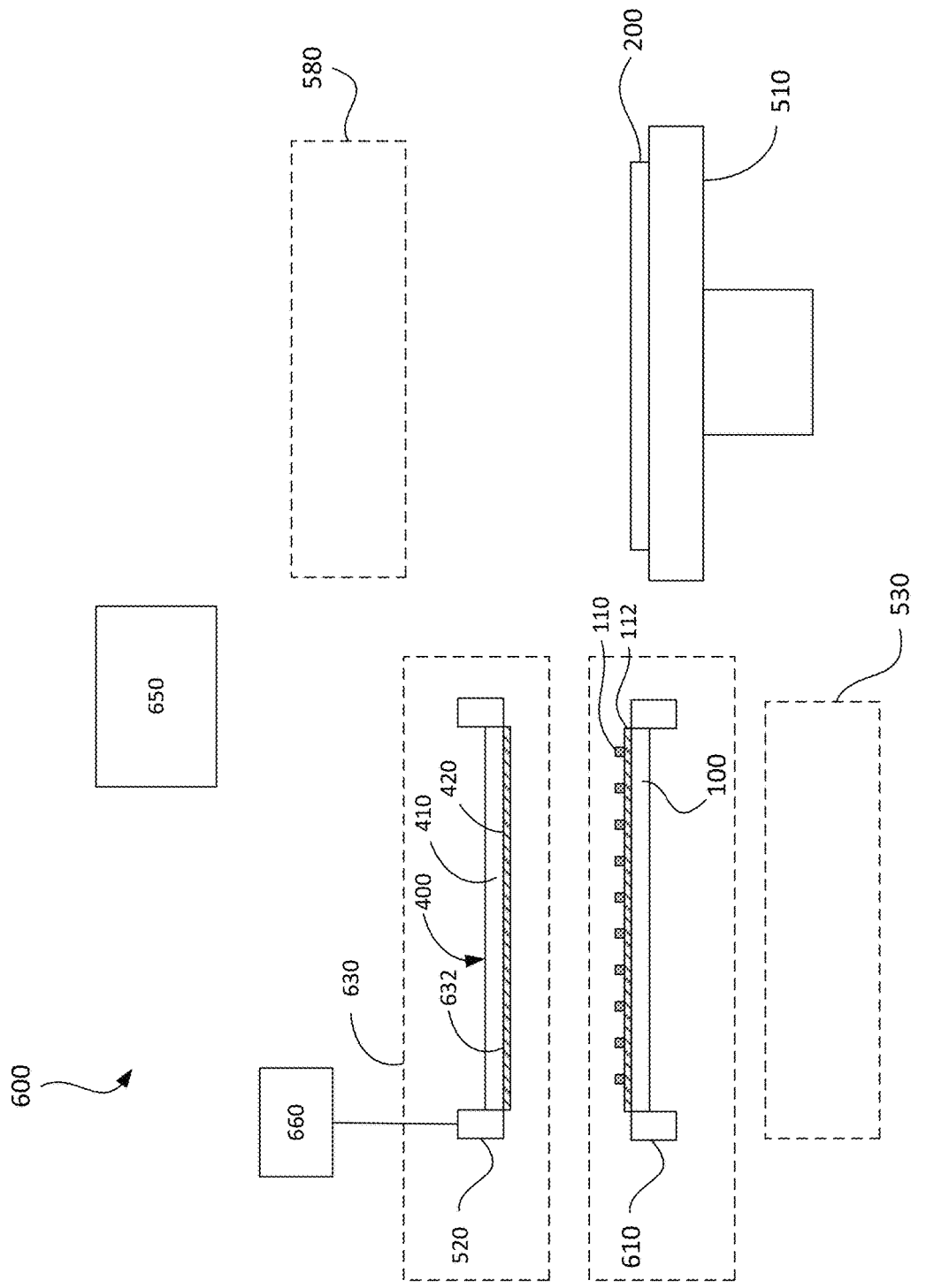
FIG. 13A is a schematic cross-sectional side view of a system for transferring micro-devices from a donor substrate to a destination substrate.

FIG. 13A illustrates a system 600 for transferring the micro-devices from the donor substrate 100 to the destination substrate 200. For the purpose of discussion, the Z-axis is direction perpendicular to the plane of the substrates 100, 200, and the X-axis and Y-axis are the two perpendicular directions that are parallel to the plane of the substrates 400. Typically the Z-axis will be a vertical axis, i.e., aligned with gravity, but this is not necessary.

The apparatus 600 includes a first support 610 to support the donor substrate 100, a second support 510 to support the destination substrate 200, and transfer device 630. The first support 610 can be edge support ring that supports an edge of the donor substrate 100. The second support 510 can be a stage on which the destination substrate 200 sits.

The transfer device 630 includes a surface 632 on which an adhesive layer 420 can be placed. The transfer device 630 can include a holder 520, e.g., edge support ring or an edge grip actuator, to hold a replaceable transfer substrate 410 that provides the surface 632 on which the adhesive layer 420 is formed. Alternatively, the surface 632 can be an integral part of the transfer device 630, e.g., the transfer device includes a plate-shaped body having the surface 632.

The surface 632 can be planar, e.g., the bottom of a flat sheet, and can be parallel to the top surfaces of the stages 610, 510. Alternatively, the surface 632 can be cylindrical, e.g., the outer surface of a rotatable drum.

One or more actuators 660 provide relative motion between the transfer device 630 and the supports 610 and 620. For example, the transfer device 630 can include a three-axis robotic arm that can move the surface 632 along the X-axis, Y-axis and Z-axis. However, many other arrangements are possible. For example, the stages 610, 620 could be vertically movable while the arm provides only X-axis and Y-axis movement, or the stages could move along the Y-axis, etc. Assuming, the transfer device 630 includes a replaceable transfer substrate 410, the robotic arm can include an end effector to hold the substrate. The end effector can be a vacuum chuck or an edge grip actuator.

The apparatus 600 also include a system to selectively "neutralize" portions of the adhesive layer 112 that attach the microdevices 110 to the donor surface substrate 100 and/or a system to selectively "neutralize" portions of the adhesive layer 420 on the surface 632. In this context, "neutralize" includes either removing the adhesive layer entirely, e.g., by dissolving or melting, or modifying the physical property of the material so that it is no longer adhesive (also termed "denaturing"). Each system can be an illumination system configured to selectively direct light from a light source onto the back side of the body that to which the microdevices are attached. In particular, the apparatus 600 can include an illumination system 530 to selectively direct light onto the back side of the donor substrate 100 and/or an illumination system 580 to selectively direct light onto the back side of the body, e.g., the transfer substrate 410, that provides the surface 632. Alternatively or in addition, the system can include individually controllable heaters embedded in the body that provides the surface 632.

A controller 650, such as a programmable computer, coordinates operation of the various components of the apparatus, e.g., the actuators 660 and illumination systems 530, 580. In operation, the adhesive layer 420 on the surface 632 is lowered into contact with micro-devices 110 on the donor substrate 100. The adhesive layer 112 is neutralized in selected regions, and the surface 632 is lifted away with the micro-devices 110 corresponding to the neutralized regions secured to the adhesive layer 420 and lifted away with the surface 632. The micro-devices 110 on the adhesive layer 420 are moved laterally over to the destination substrate 200, and lowered onto the destination substrate 200. Then the adhesive layer 420 is neutralized in selected regions, and the surface 632 with the remaining adhesive layer 420 is lifted away from the destination substrate 200, leaving micro-devices remaining on the destination substrate at spots corresponding to regions where the adhesive layer 420 was neutralized. Although the description above is phrased as the surface 632 providing the relative motion, it will be understood that motion of the supports 610, 620 could provide some or all of the necessary relative motion.

Figure 3:
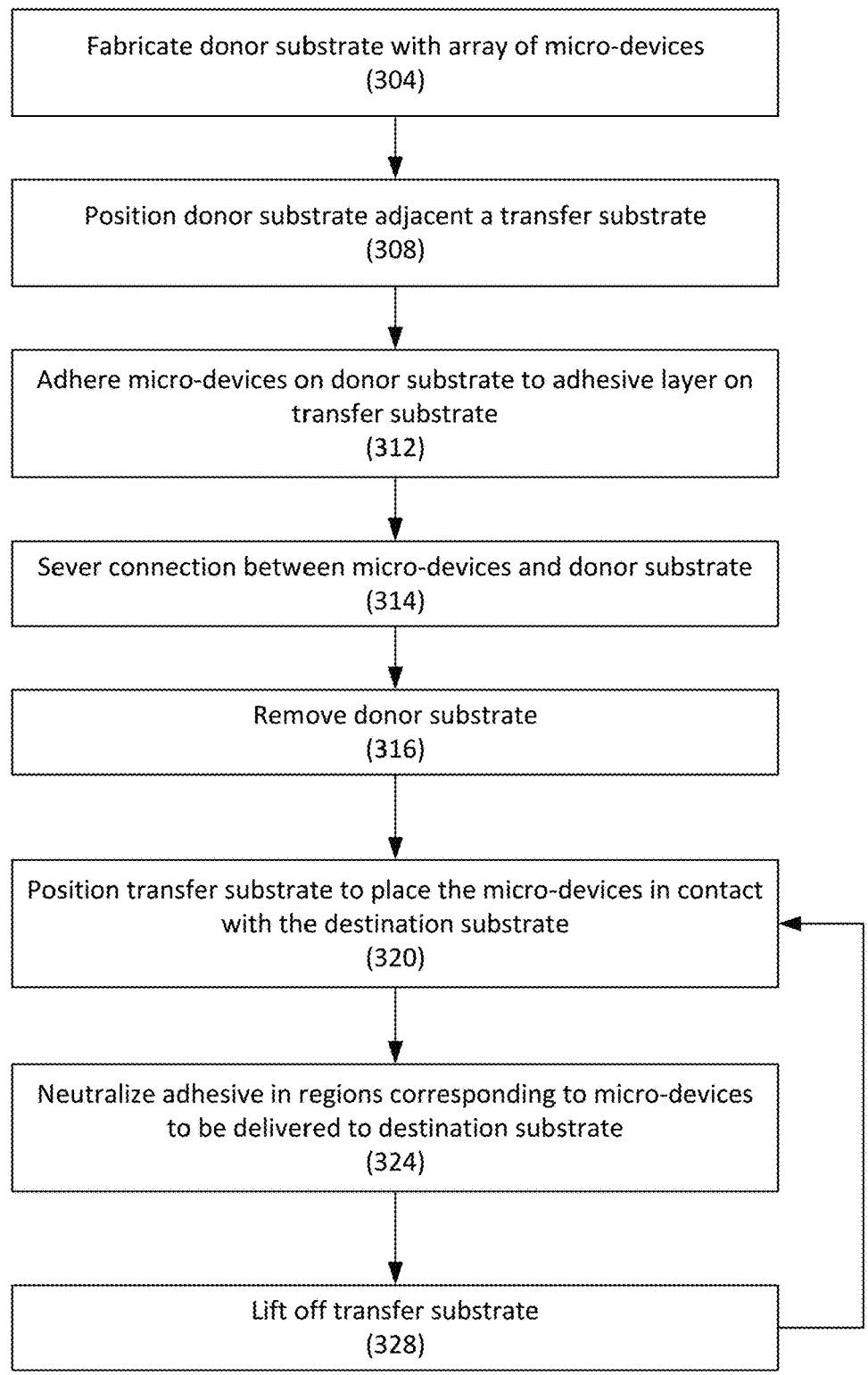
FIG. 3 is a flow diagram of a method for transferring multiple micro-devices from the donor substrate to the destination substrate.

FIG. 3 is a flow diagram of a method 300 for transferring multiple micro-devices from the donor substrate to the destination substrate. FIGS. 4-12 are schematic cross-sectional side views illustrating a method of transferring multiple micro-devices from the donor substrate to the destination substrate.

Figure 4:
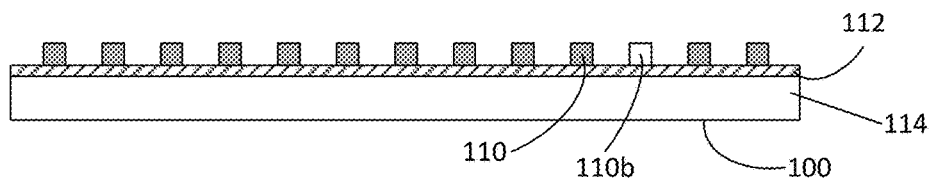
FIGS. 4-12 are schematic cross-sectional side views illustrating a method of transferring multiple micro-devices from the donor substrate to the destination substrate.

As shown in FIG. 4, the donor substrate 100 with the array of micro-devices 110 is fabricated or received from a fabrication plant (step 304). The donor substrate 100 can include a body 114, e.g., a glass or sapphire wafer 114, on which the adhesive layer 112 is formed. The body 114 is a material, e.g., glass or quartz, that is substantially transparent to a wavelength of light that will be used to neutralize the adhesive layer 112. The adhesive layer 112 can be a UV-sensitive adhesive that becomes neutralized when exposed to UV light. For example, the adhesive layer 420 can be adhesive polymer, e.g., an uncured or partially cured positive photoresist. The micro-devices 110 are secured to the body 114 by the adhesive layer 112.

The adhesive layer 112 extends across at least portions of the surface of the donor substrate 100 corresponding to the array of micro-devices 110. In some implementations, the adhesive layer 112 is a continuous unitary layer spanning all of the micro-devices 110. The advantage of such a layer is that the donor substrate 100 does not need to be precisely laterally positioned relative to the device substrate during transfer. Alternatively, the adhesive layer 112 could be applied in individual spots corresponding to the locations of the micro-devices 110 on the device substrate 100, or in stripes or other patterns.

In some implementations, the support body 114 is segmented into a plurality of separate islands, each island corresponding to one of the micro-devices 110. However, in such implementations, the donor substrate 100 will need to be laterally positioned so that the islands contact the micro-devices 110 on the device substrate.

Figure 5:
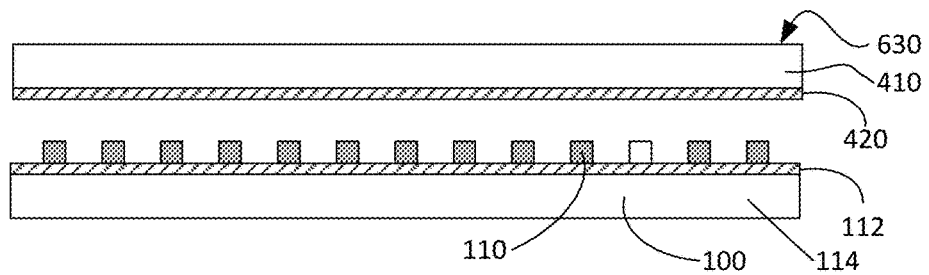

As shown in FIG. 5, the donor substrate 100 is positioned adjacent a surface 632 of a transfer device 630 (step 308). The donor substrate 100 is oriented so that the micro-devices 110 are on the side of the donor substrate 100 facing the transfer device 630. The transfer device includes an adhesive layer 420. The adhesive layer 420 can be part of a removable transfer substrate 400. The adhesive layer 420 can also be a UV-sensitive adhesive that becomes neutralized when exposed to UV light. The adhesive layer 420 can be adhesive polymer, e.g., an uncured or partially cured positive photoresist.

The adhesive layer 420 extends across at least portions of the surface 632 corresponding to the array of micro-devices 110. In some implementations, the adhesive layer 420 is a continuous unitary layer spanning all of the micro-devices 110. The advantage of such a layer is that the transfer device 630 does not need to be precisely laterally positioned relative to the donor substrate 100. In some implementations, the adhesive layer 632 is segmented into a plurality of separate islands, each island corresponding to one of the micro-devices 110. However, in such implementations, the transfer device 630 will need to be laterally positioned so that the islands contact the micro-devices 110 on the donor substrate 100.

The adhesive layer 420 can be applied to the surface 632 of the transfer device 630 by spin-coating or by droplet printing. The body that provides the surface 632, e.g., the backing substrate 410, is a material, e.g., glass or quartz, that is substantially transparent to a wavelength of light that will be used to cure or dissolve the adhesive layer 420.

Although FIG. 5 illustrates the adhesive layer 420 as a continuous layer, this is not required. For example, the adhesive layer 420 could be applied in individual spots corresponding to the locations of the micro-devices 110 on the donor substrate 100, or in stripes or other patterns.

Figure 6:
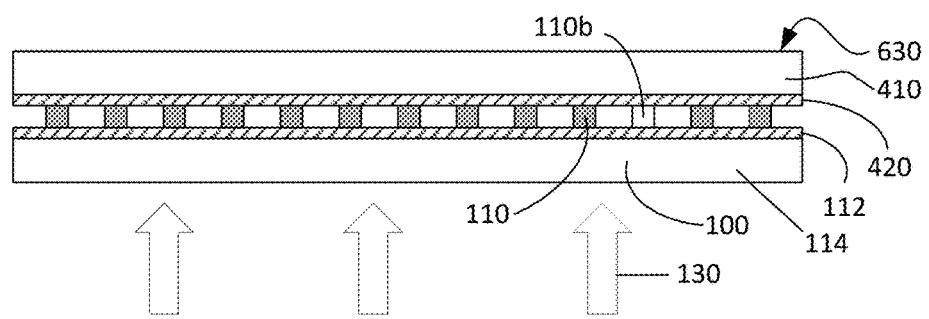

As shown in FIG. 6, the transfer device 630 is then placed adjacent the donor substrate 100 so that the micro-devices 110 adhere to the adhesive layer 420 (step 312).

As an alternative to the method shown in FIGS. 5-6, the adhesive layer 420 could be deposited directly onto the donor substrate 100 so that the adhesive material at least covers the micro-devices 110. For example, a blanket continuous layer 420 of adhesive material can be deposited across at least the array of micro-devices 110. Then the surface 632 of the transfer device 630 can be lowered into contact with the adhesive layer 420.

Figure 7:
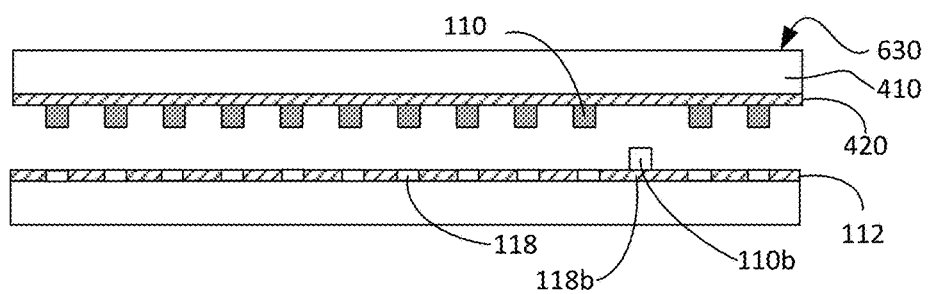
Figure 13B:
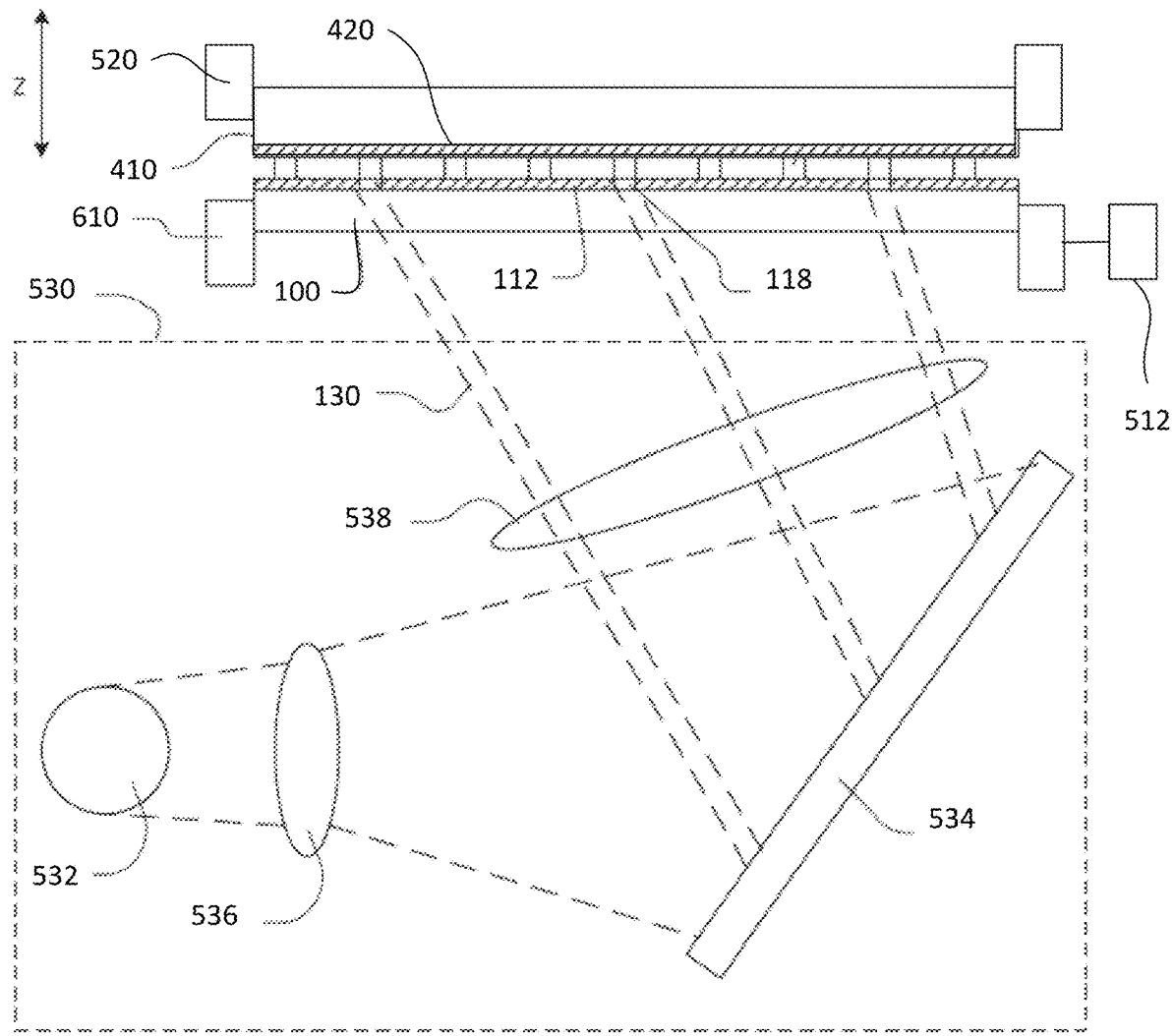
FIG. 13B is a schematic cross-sectional side view of a system for illuminating the adhesive layer on a donor substrate.

Referring to FIGS. 6 and 7, the connections between the micro-devices 110 and the donor substrate 100 are severed (step 314). For example, selected regions 118 of the adhesive layer 112 that correspond to micro-devices 110 desired to be delivered to the transfer device 630 are neutralized, e.g., removed or denatured, by radiation 130 from the illumination system 530 (see FIGS. 13A and 13B). Alternatively, if the micro-devices 110 were fabricated directly on the donor substrate 100, then a laser lift-off technique can be used to detach the micro-devices from the underlying wafer. For example, a light source, e.g., a UV laser, can be used to ablate a region where each micro-device 110 is attached to the donor substrate 100, thus detaching the donor substrate 100 from the micro-devices 110. As another example, an infra-red heat source can be used to melt a region where the micro-devices 110 are attached to the donor substrate 100.

In some implementations, not all of the micro-devices 110 are transferred from the donor substrate 100 to the transfer device 630. For example, the micro-devices may be subject to testing, e.g., while attached to the donor substrate 100, to detect one or more defective micro-devices 110b. In this case, a region 118b of the adhesive layer 112 that corresponds to the defective micro-device 110b is not neutralized.

Figure 8:
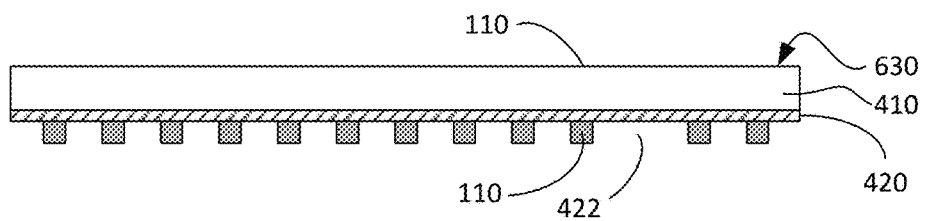

As shown in FIGS. 7 and 8, the donor substrate 100 can now be removed (step 316), leaving the micro-devices 110 attached to the adhesive layer 420 on the transfer device 630. Optionally, one or more micro-devices, e.g., a defective micro-device 110b, will remain on the donor substrate 100. Assuming the adhesion of the micro-devices 110 to the adhesive layer 112 is stronger than the adhesion of the micro-devices 110 to the adhesive layer 420, then micro-devices will remain in regions 118b where the adhesive layer 112 was not neutralized.

Figure 9:
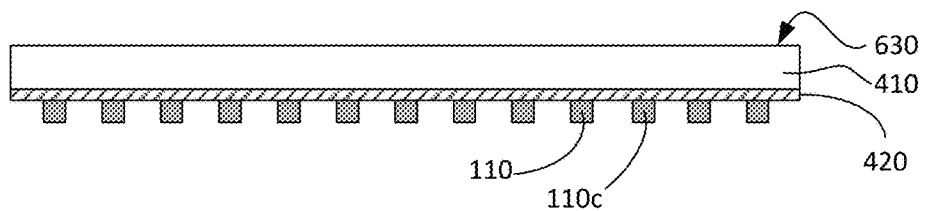

As shown in FIGS. 8 and 9, one or more functional micro-devices 110c can optionally be placed on the transfer substrate 410 at the one or more locations 422 where micro-devices were not transferred, e.g., in one or more locations corresponding to defective micro-devices. For example, the functional micro-devices can be positioned on the adhesive layer 420 on the transfer substrate 410 using a conventional pick-and-place robot.

Figure 10:
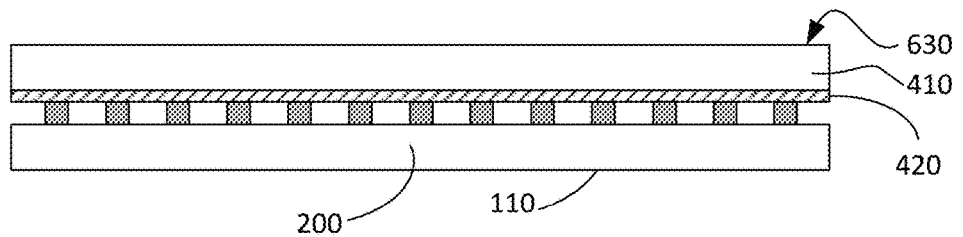

Referring to FIG. 10, the transfer device 630 can be positioned to place the micro-devices 110 in contact with the destination substrate 200 (step 320).

Figure 11:
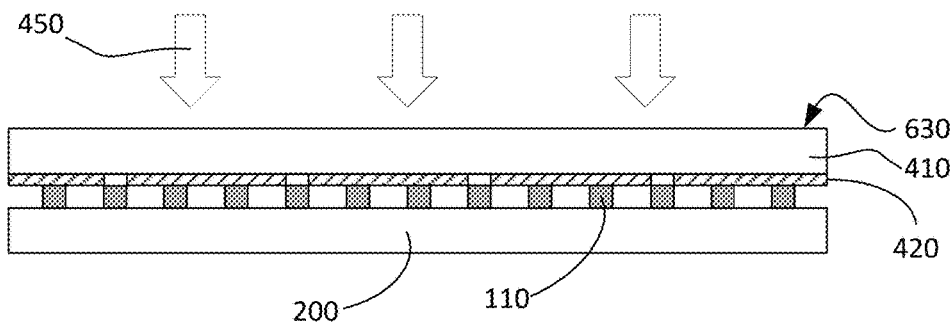
Figure 13C:
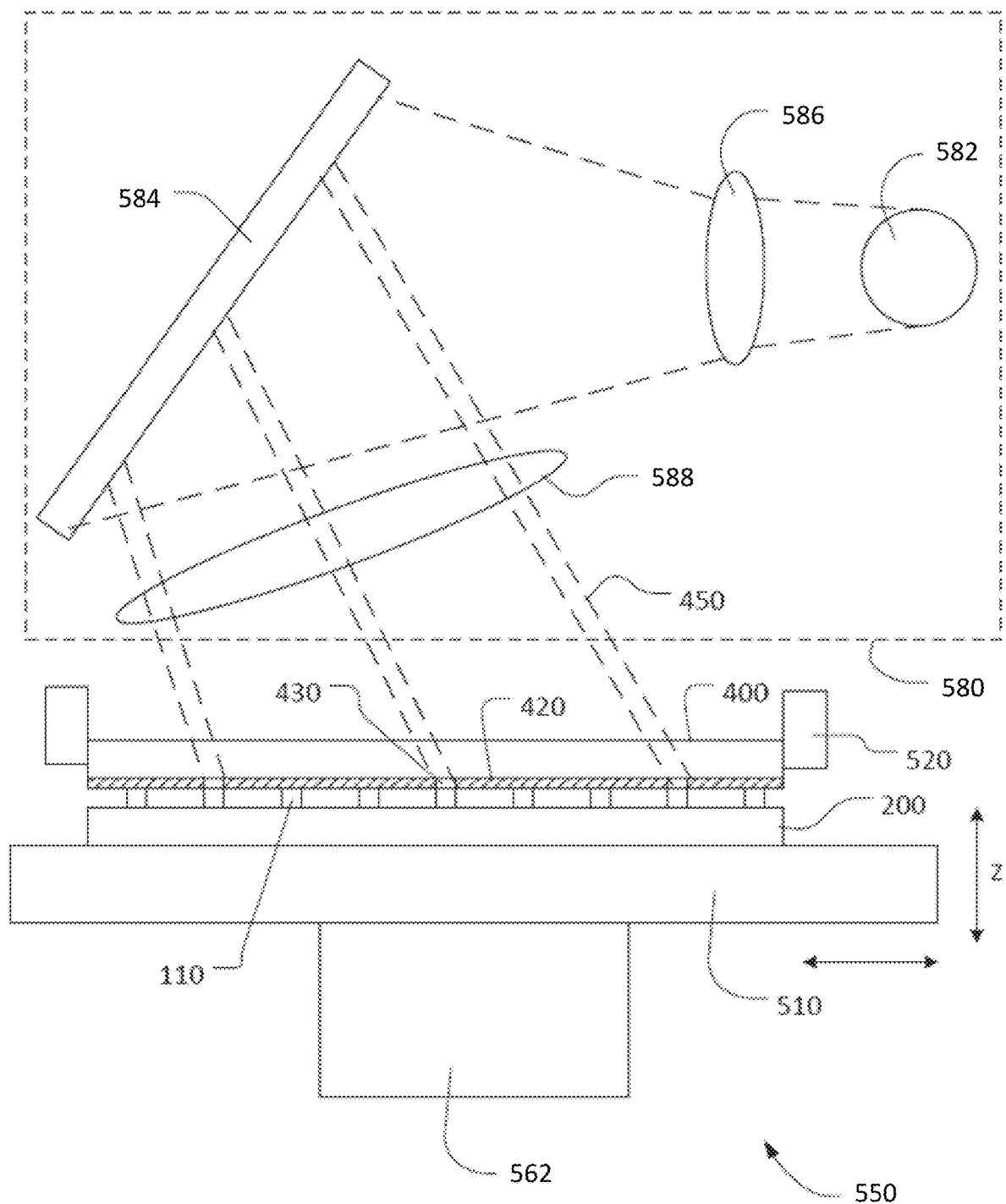
FIG. 13C is a schematic cross-sectional side view of a system for illuminating the adhesive layer on a transfer substrate.

Referring to FIGS. 10 and 11, selected regions 430 of the adhesive layer 420 that correspond to micro-devices 110 desired to be delivered to the destination substrate 200 are neutralized, e.g., removed or denatured (step 324). For example, light 450 can be selectively directed by the illumination system 580 (see FIGS. 13A and 13C) through the body that provides the surface 632, e.g., the backing substrate 410, to the regions 430. The light 450 can neutralize, e.g., melt or dissolve the regions 430 of the adhesive layer 420, or cure the regions 430 into a non-adhesive composition. In some implementations, the light exposes the adhesive layer 420, and the exposed portion is removed with a developer.

Figure 12:
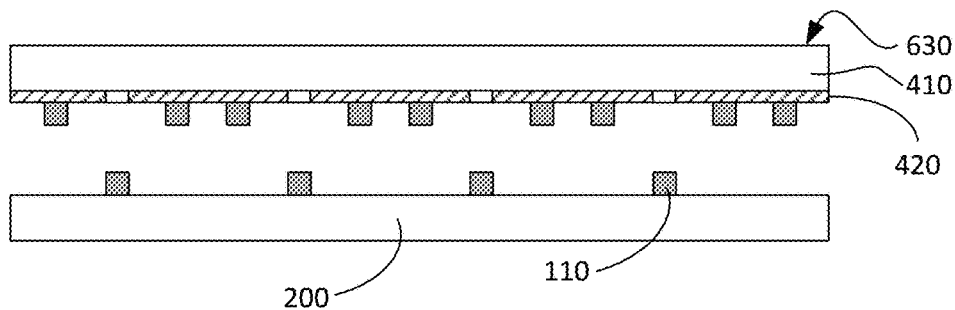

As shown in FIGS. 12 and 14-15, once the selected regions 430 have been illuminated, the transfer device 630 can be lifted off, leaving the selected micro-devices 110a in place on the destination substrate 200 (step 328). The remaining micro-devices 110b where the adhesive layer 430 was not exposed remain on the transfer substrate 400.

FIG. 11B illustrates an apparatus 500 for transferring the micro-devices from the donor substrate 100 to the transfer substrate 400. FIG. 11C illustrates a similar apparatus 550 for transferring the micro-devices from the transfer substrate 400 to the destination substrate 200. For the purpose of discussion, the Z-axis is direction perpendicular to the plane of the transfer substrate 400, and the X-axis and Y-axis are the two perpendicular directions that are parallel to the plane of the transfer substrate 400. Typically the Z-axis will be a vertical axis, i.e., aligned with gravity, but this is not necessary.

Returning to FIG. 11B, the apparatus 500 includes the support 610, e.g., an edge support ring or edge grip actuator, to support the donor substrate 100, and holder 520, e.g., an edge support ring or edge grip actuator, to hold the transfer substrate 400. An actuator 512, such as a linear actuator, can provide relative motion along the Z-axis between the support 610 and the holder 520. The actuator 512 can be coupled to and configured to move the stage 510 along the Z-axis while the holder 520 remains stationary, or vice-versa.

The apparatus 500 also includes an illumination system 530. The illumination system 530 includes a light source 532 and a mechanism to selectively and direct light from the light source onto the back side of the donor substrate 100. In one implementation, the illumination system 530 includes a two-dimensional array of independently controllable mirrors, e.g., a digital micro-mirror device (DMD) 534. The illumination system 530 can also include illumination optics 536 to direct light from the light source 532 to the DMD 534, and/or projection optics 538 to direct light reflected by activated mirrors of the DMD 534 onto the adhesive layer 112. By controlling which mirrors of the DMD 534 are activated, light 450 can be selectively directed to the desired regions 118.

Referring to FIG. 11C, the apparatus 550 is similar to the apparatus 500, and includes a stage 510 to support the destination substrate 200, and the holder 520, e.g., an edge support ring or edge grip actuator, to hold the transfer substrate 400. An actuator 562, such as a linear actuator, can provide relative motion along the Z-axis between the stage 510 and the holder 520. As illustrated, the actuator 512 can be coupled to and configured to move the stage 510 along the Z-axis while the holder 520 remains stationary, or vice-versa.

The apparatus 500 also includes an illumination system 580. The illumination system 580 includes a light source 582 and a mechanism to selectively direct light from the light source onto the back side of the transfer substrate 400. In one implementation, the illumination system 580 includes a two-dimensional array of independently controllable mirrors, e.g., a digital micro-mirror device (DMD) 584. The illumination system 580 can also include illumination optics 586 to direct light from the light source 582 to the DMD 584, and/or projection optics 588 to direct light reflected by activated mirrors of the DMD 584 onto the adhesive layer 420. By controlling which mirrors of the DMD 584 are activated, light 450 can be selectively directed to the desired regions 430.

Referring to FIG. 11C, each of the DMD 534 and the DMD 584 can include a plurality of independently mirrors 550, e.g., a two-dimensional array of mirrors 550. Each mirror 550 can be independently tilted between a first position, e.g., shown by mirror 550a, in which incident light from the light source 532 is reflected and passed to the projection optics 538 and illuminates a particular pixel in an imaging plane (e.g., the adhesive layer on the transfer substrate 400), and a second position, e.g., shown by mirror 550b, in which incident light from the light source 532 is reflected along a path such that the reflected light does not reach the imaging area (e.g., the adhesive layer on the transfer substrate 400). The mirrors 550 can be supported on posts 552 above a substrate 554 on which circuitry is formed to control the individual mirrors 550; many other forms of DMDs are possible.

Each of the light source 532 and 582 can be an arc lamp, e.g., a mercury arc lamp, or a laser, e.g., a solid state laser diode. One end of a bundled group of optical fibers can be coupled to one or more laser diodes; light from the other end of the optical fibers can be directed to the illumination optics or sent directly to the DMD.

In some implementations, one or more additional actuators provide relative motion along the X-axis and Y-axis between the support 610 or the stage 510 and the holder 520. Again, the actuator can be coupled to and configured to move the support 610 or the stage 510 in the X-Y plane while the holder 520 remains stationary, or vice-versa. For example, the support 610 or the holder 520 can be positioned on a robot arm that provides motion in the X-Y plane.

Further discussion of an illumination system that includes a DMD can be found in U.S. Patent Publication Nos. 2016/0282728, 2016/0219684 and 2016/0124316. In particular, U.S. Patent Publication No. 2016/0124316 discusses an optical system that includes an illumination-projection beam separator that could be used to direct light from the light source 532/582 onto DMD 534/584 and separate the reflected light 130/450.

In some implementations, the field of view of the projection optics 538 or 588 spans the entire donor substrate 100 or transfer substrate 400. In this case, it is not necessary to have lateral motion between the light 130 and the donor substrate 100 or between the light 450 and the transfer substrate 400. However, in some implementations, the field of view of the projection optics 538 or 588 spans only a portion of the donor substrate 100 or transfer substrate 400. In this case, an actuator could provide relative motion in the X-Y plane between the illumination system 530 and the donor substrate 100 or between the illumination system 580 and the transfer substrate 400 between exposures of the donor substrate 100 or transfer substrate 400, respectively.

Rather than a two-dimensional array of mirrors, the illumination system 530 or 580 could include a linear array of mirrors, and an actuator could provide relative motion in the X-Y plane between the illumination system 530 or 580 and the transfer substrate 400 to scan the linear array of mirrors across the transfer substrate 400. Alternatively, the illumination system 530 or 580 could include a linear array of mirrors, and an actuator, e.g., a galvo, could rotate the linear DMD array 534 or 584 to scan the resulting reflected light across the donor substrate 410 or the transfer substrate 400.

As another implementation, a light beam, e.g., from a laser, could be raster scanned across the donor substrate 100 or the transfer substrate 400, and modulated as it scans to provide the same function as the DMD. For example, the illumination system 530 or 580 could include a 2-axis mirror gimbal that that can rotate a single mirror about two perpendicular axes and thus scan the light beam along two perpendicular axes on the transfer substrate. As another example, the illumination system 530 or 580 could include two galvo mirror scanners in series (along the path of the light beam), that permit the light beam to be scanned along two perpendicular axes on the transfer substrate.

Referring to FIGS. 1-2 and 14, the initial spatial density of micro-devices on the donor substrate 100, and thus on the transfer device 630, is greater than the spatial density of the spots 210 on the destination substrate 200. However, assuming that the spots 210 align with particular micro-devices 110 on the transfer substrate, just those micro-devices 110 that correspond to the spots 210 can be transferred. For example, if the pitch PX2 is an integer multiple of the pitch PX1 and the pitch PY1 is an integer multiple of the pitch PX2, then one of every (PX2*PY1)/(PX1*PY1) micro-devices 110 will be transferred. For a rectangular array, the transferred micro-devices 110 can be positioned every PX2/PX1 columns and every PY2/PY1 rows.

As shown in FIG. 15, the resulting transfer device 630' will be have cells 440 that are missing micro-devices 110b. However, the transfer device 630' can be reused for additional destination substrates 200. In brief, steps 320, 324, 328 can be repeated, but with a different destination substrate and using a different set of micro-devices from the transfer device 630. That is, the transfer device 630' can be positioned adjacent the new destination substrate, but with a different set of micro-devices aligned with the spots 120. For example, the transfer device 630' can be shifted by one cell for each cycle. Ideally, for a rectangular array, this would permit the transfer device 630 to be used a total of (PX2*PY2)/(PX1*PY1) times.

As shown in FIG. 16, some products may need multiple micro-devices 110i, 110j, 110k of different types in each cell 205. For example, for a color LED display may need three micro-LEDs, one for each of red, blue and green. Each micro-LED can provide a sub-pixel. A variety of patterns are possible for the sub-pixels. For example, the different colored sub-pixels can simply be arranged in a single row or column. Alternatively, for example, the sub-pixels within a cell can be arranged in a quincunx pattern with two sub-pixels each of two colors, e.g., red and green, and a single sub-pixel of the third color, e.g., blue (this pattern is also known as a PenTile matrix). The transfer techniques can be used to form displays with more than three color sub-pixels, e.g., a display with red, green, blue and yellow micro-LEDs.

The different color LEDs can be LEDs with phosphor layers that emit differently colored light, or they can be LEDs with different colored filter layers, or they can be LEDs that emit white light but also include an overlaying phosphor material that absorbs the white light and re-emits differently colored light (this material can be quantum dots).

The different micro-devices, e.g., the different color micro-LEDs, can be fabricated on different donor substrates at higher spatial density than needed for the destination substrate. The transfer process can then be performed for each donor substrate. That is, the micro-devices from each particular donor substrate can be transferred to its own transfer substrate. For example, there can be a transfer substrate with blue micro-LEDs, a transfer substrate with red micro-LEDs, and a transfer substrate with green micro-LEDs. For each transfer substrate, a micro-device can be transferred for each cell to the destination substrate.

As shown in FIG. 17, in some implementations, the destination substrate 200 is a flexible substrate. For example, the destination substrate 200 can be a flexible circuit and micro-devices 110 can be micro-LEDs, thus providing a flexible display screen. Alternatively or in addition, the destination substrate 200 can a stretchable substrate.

The discussion above has assumed that the donor substrate (and thus the target substrate) has a micro-device that aligns properly with the destination spot for each cell on the destination substrate. This permits all the micro-devices to be transferred from the transfer substrate to the destination substrate in a single release operation (i.e., exposing all the corresponding regions of the adhesive layer simultaneously).

However, it may be the case that the spacing between the micro-devices on the donor substrate is such that it is not possible to transfer all the micro-devices to the destination spots in a single release operation. For example, the pitch PX2 might not be an integer multiple of the pitch PX1 and/or the pitch PY1 might not be an integer multiple of the pitch PX2.

Figure 18:
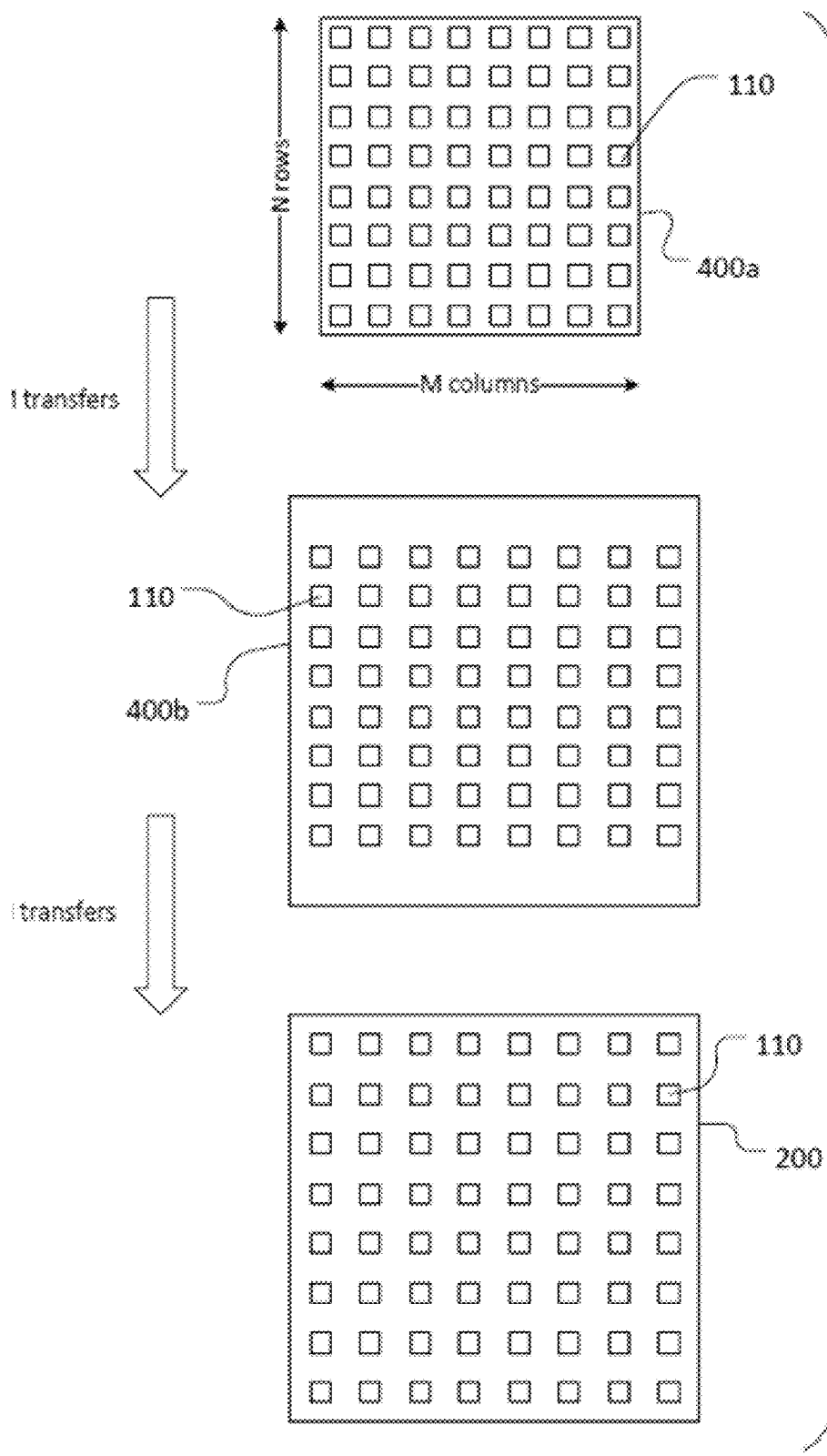
FIG. 18 is a schematic top view illustrating a multi-step transfer process.

Never-the-less, it is still possible to achieve significant increase in manufacturing throughput, at least as compared to having to pick-and-place individual micro-devices. Referring to FIG. 18, a modified process permits micro-devices to be placed in a rectangular array that has an arbitrary spacing relative to the original spacing of the micro-devices on the donor substrate.

Initially, the micro-devices 110 are transferred from a donor substrate to a first surface of a first transfer device, e.g., a first transfer substrate 400a. The micro-devices 110 are arranged on the first transfer substrate 400a at a pitch PX1 along the X-axis and a pitch PY1 along the Y-axis. The first transfer substrate 400a is then positioned adjacent a second surface of a second transfer device, e.g., a second transfer substrate 400b. Rather than transferring all of the micro-devices at once to the second transfer substrate, a single column at a time is transferred, with the first transfer substrate undergoing lateral re-positioning between each transfer to provide the appropriate spacing in one of the directions. Then the micro-devices are transferred from the second transfer substrate to the destination substrate one row at a time, with the first transfer substrate undergoing lateral re-positioning between each transfer to provide the appropriate spacing in the other direction.

For example, supposing the destination substrate has N rows and M columns of cells to receive micro-devices 110. The first transfer substrate 400a is be positioned adjacent the second substrate 400b, and the illumination system would be controlled to illuminate regions corresponding to N micro-devices 110 within a single column. So a single column containing N micro-devices 110 would be transferred to the second transfer substrate 400b. Then the first transfer substrate 400a is shifted relative to the second transfer substrate 400b along the X-axis, and the illumination system is controlled to illuminate regions corresponding to another N micro-devices 100 within another single column, thus placing another column of N micro-devices. This process of shifting and placing is repeated M−1 times, until M columns with N rows of micro-devices are transferred to the second transfer substrate 400b. The amount of the shift of the first transfer substrate 400a relative to the second transfer substrate 400b is such that the pitch of the micro-devices along the X-axis on the second transfer substrate 400b matches the desired pitch PX2 for the destination substrate. The pitch of the micro-devices along the Y-axis can be PY1, or an integer multiple of PY1.

Once the array of M columns with N rows of micro-devices are transferred to the second transfer substrate 400b, the micro-devices 110 can be transferred to the destination substrate 200. The second transfer substrate 400b is positioned adjacent the second substrate 400b, and the illumination system is controlled to illuminate regions corresponding to M micro-devices 110 within a single row. So a single row containing M micro-devices 110 would be transferred to the destination substrate 200. Then the second transfer substrate 400b is shifted relative to the destination substrate 200 along the Y-axis, and the illumination system is controlled to illuminate regions corresponding to another M micro-devices 100 within another single row, thus placing another row of M micro-devices. This process of shifting and placing is repeated N−1 times, until N rows of M columns of micro-devices are transferred to the destination substrate 200. The amount of the shift of the second transfer substrate 400b relative to the destination substrate 200 is such that the pitch of the micro-devices along the Y-axis on the destination substrate 200 matches the desired pitch PY2 for the destination substrate 200. As a result, the pitch of the micro-devices on the destination substrate is now PX2 along X-axis and PY2 along Y-axis, with any arbitrary relationship between PX1 and PX2, and between PY1 and PY2.

An advantage of this multi-step transfer process is that the total number of transfer steps is approximately M+N. While for a high resolution display this total M+N may still be a large number, it is much smaller than the number of transfer steps that would be required for individual pick-and-place, i.e., M*N.

In some implementations, the micro-devices are inspected or tested before being transferred to the destination substrate. Testing might occur while the micro-devices are still on the donor substrate, or inspection might occur while the micro-devices are on the transfer substrate. For each cell where inspection or testing indicates that the micro-device is defective, the illumination system of the transfer system is controlled to not illuminate the region of the transfer substrate corresponding to the defective micro-device. Thus, the identified defective micro-devices are not transferred to the destination substrate. Any cell on the destination substrate that thus lacks a micro-device can receive a functional micro-device in a later pick-and-place operation. This permits the destination substrate, and thus the product, to be fabricated with very high yield.

For some implementations, depending on which side of the micro-device is required to contact the destination substrate, it may be necessary to transfer the micro-devices to a third transfer substrate (which could be before the first transfer substrate, after the second transfer substrate, or between the first and second transfer substrates) in order to flip the micro-devices.

Another technique to control which micro-devices are transferred from a donor substrate to a transfer substrate, or from a transfer substrate to a destination substrate, is to modify a portion of an adhesive layer so that it remains adhesive after a subsequent treatment step. Such a process is illustrated in FIGS. 19-22.

Figure 19:
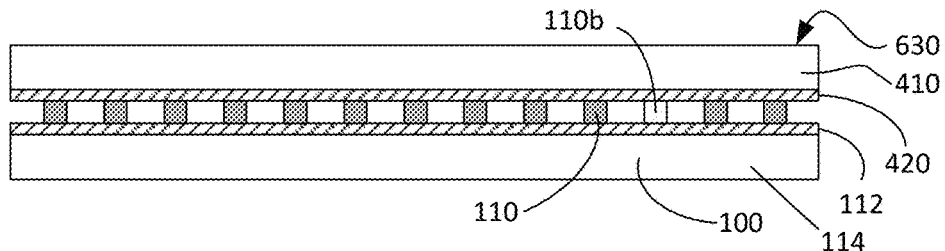
FIGS. 19-22 are schematic cross-sectional side views illustrating another method of transferring multiple micro-devices from a donor substrate to a transfer substrate.

As shown in FIG. 19, the transfer substrate 410 of the transfer device 630 has to be positioned adjacent the donor substrate 100 so that the micro-devices 110 adhere to the adhesive layer 420 on the transfer substrate 410.

Figure 13D:
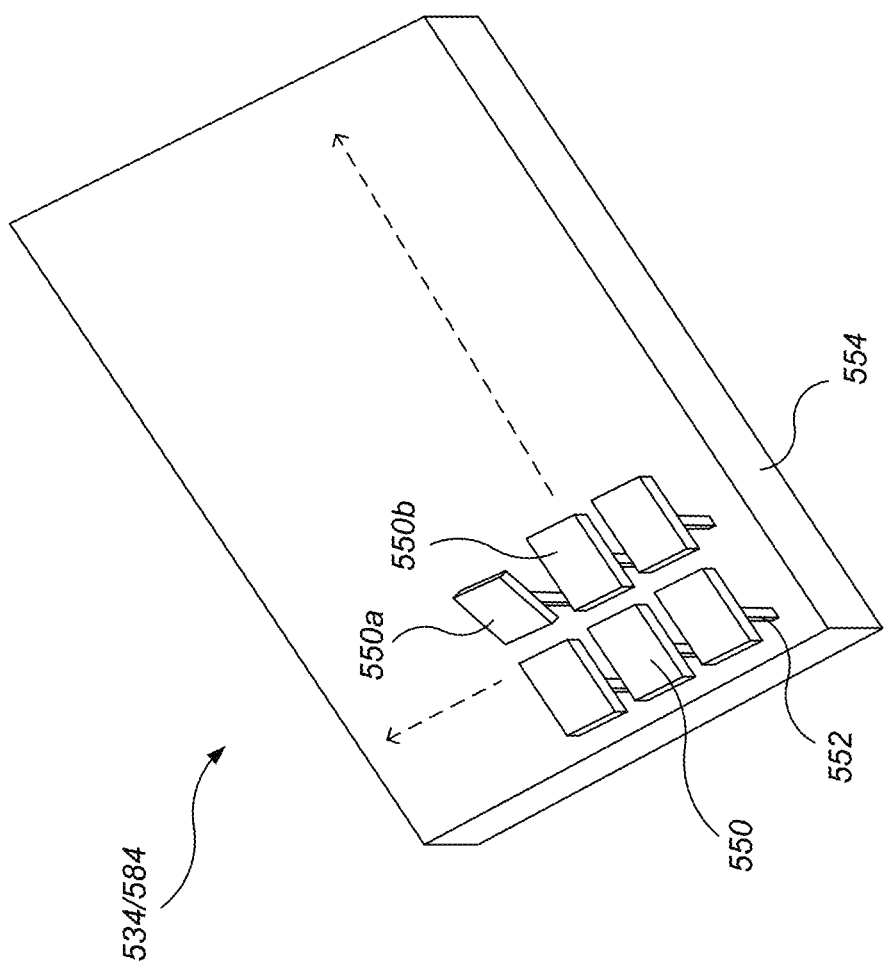
FIG. 13D is a schematic perspective view of a digital micro-mirror device.
Figure 20:
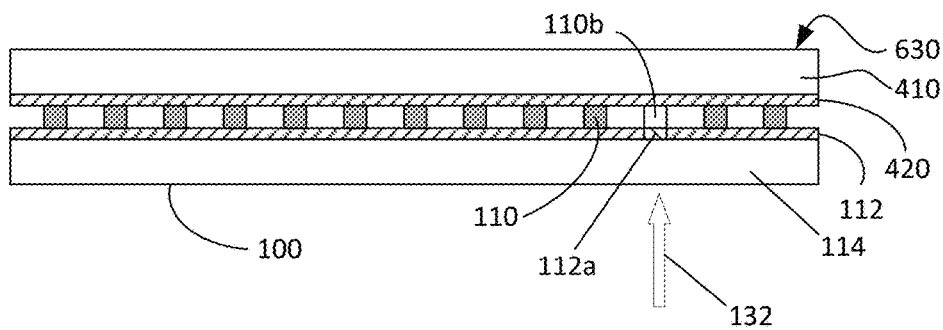

As shown in FIG. 20, at least one region 112a of the adhesive layer 112 on the donor substrate 114 is treated so it will remain adhesive during a subsequent illumination step. For example, the adhesive layer 112 may be a material that reacts differently to exposure to two different wavelengths of light. A first wavelength of light may neutralize the adhesive, e.g., cure the material so that it is no longer adhesive. In contrast, a second wavelength of light may induce a chemical change in the material so that the material is no longer sensitive to the first wavelength. For example, light 132 of the second wavelength can be directed from the backside of the donor substrate 100 and through the donor substrate 100 to irradiate the regions of the adhesive layer 112. The light 132 can be from, e.g., a laser scanning system or a digital micro-mirror device (DMD), e.g., an array as shown in FIG. 13D.

The region(s) 112a that are treated can correspond to one or more defective micro-devices 110b. For example, the micro-devices may be subject to testing, e.g., before the transfer substrate has been positioned, to detect one or more defective micro-devices 110b. The region(s) 112a of the adhesive layer 112 corresponding to the detected defective micro-device(s) 110b are treated.

Alternatively or in addition, the region(s) 112a that are treated can correspond to one or more micro-devices 110c that are not part of the subset of the micro-devices 110 that are to be transferred. For example, this could be done to transfer micro-devices located at a certain pitch, or to transfer only certain rows or columns of micro-devices.

Figure 21:
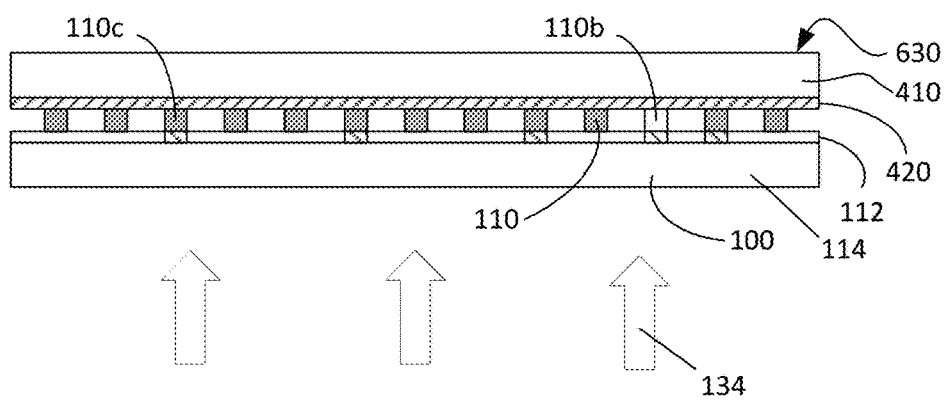

Referring to FIG. 21, the adhesive layer 112 is then illuminated to neutralize, e.g., remove or denature, at least some portions of the untreated region of the adhesive layer 112. For example, light 134 of the first wavelength can be directed through the backside of the transfer substrate 100. This light 134 can irradiate both the treated and untreated regions of the adhesive layer.

In some implementations, the entire adhesive layer 112 is illuminated. In this case, the light 134 can be from a generally wide area collimated light source, e.g., a lamp with appropriate lenses. Alternatively, the light can irradiate selected regions. In this case, the light 134 can be from, e.g., a laser scanning system or a digital micro-mirror device (DMD) array. In either case, the treated region(s) 113a of the adhesive layer corresponding to the micro-devices 110b and/or 110c remain adhesive. In contrast, other areas, e.g., the remainder of the adhesive layer 112, are neutralized.

Figure 22:
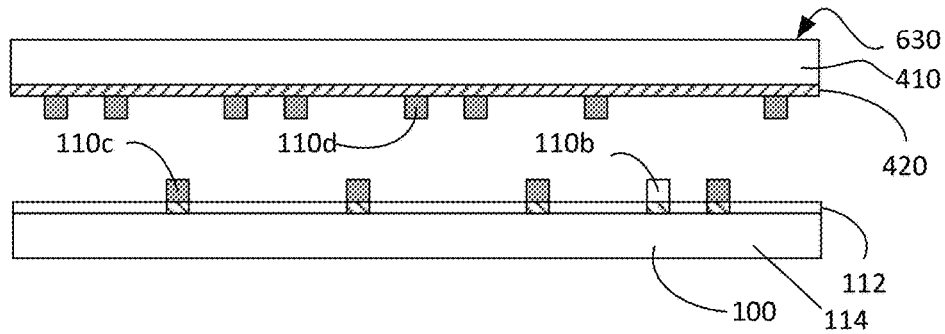

The adhesives 112, 420 are selected so that the treated region(s) 112a of the adhesive layer 112 have stronger adherence to the micro-devices than the adhesive layer 420. Thus, as shown in FIG. 22, when the donor substrate 100 and the transfer substrate 410 are separated, the micro-devices 110b and/or 110c remain on the donor substrate 100 whereas the rest of the micro-devices 110d are transferred to the transfer substrate 410.

Although FIG. 19-22 illustrate each treated region 112a as a single patch, this is not required. A treated region 112a can span multiple micro-devices 110b/c as well as the portion of the adhesive layer 112 between adjacent micro-devices 110b/c.

Figure 23:
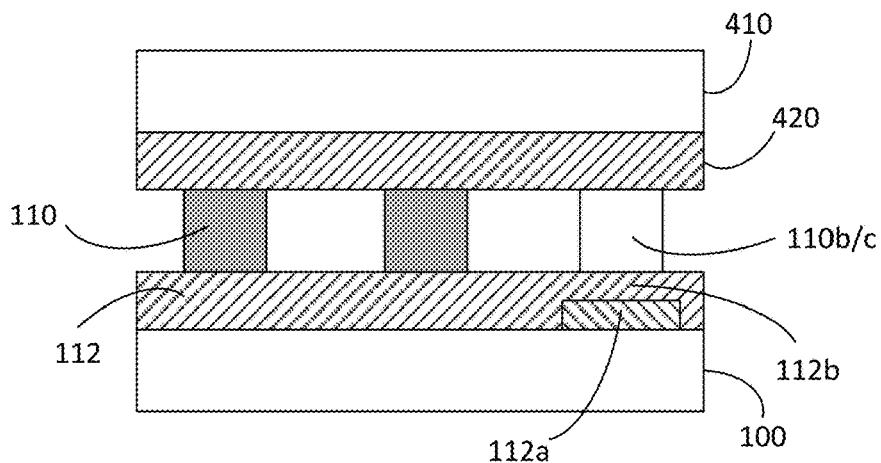
FIG. 23 is a schematic cross-sectional side view illustrating a treatment that extends partially through the thickness of an adhesive layer.

Referring to FIG. 23, it is not necessary for the treated region 112a to extend through the entire thickness of the adhesive layer 112. Treatment to a certain depth of the adhesive layer 112 may be sufficient for treated regions of the adhesive layer 112 to have stronger adherence to the micro-devices than the adhesive layer 420.

Figure 24:
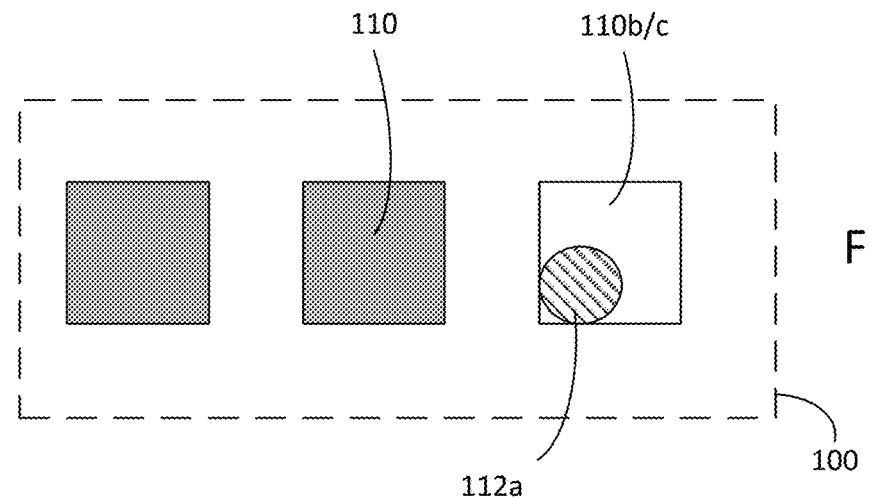
FIG. 24 is a schematic bottom view illustrating a treatment that extends partially across a micro-device.

In addition, referring to FIG. 24, it is not necessary for the treated region 112a to extend across the entire width of the micro-device 110b/c. For example, the treated region 112a can extend across just a portion of the surface area of the micro-device 110b/c. Again, treatment of the adhesive layer 112 across a certain percentage of the surface area of the micro-device can be sufficient for the treated region 112a to have stronger adherence to the micro-devices than the adhesive layer 420. The treated region can be at a corner, or overlapping an edge, or in a center of the micro-device.

Returning to FIG. 23, in addition or alternative to the rendering the adhesive no longer sensitive, a portion 112a of the adhesive layer 112 can be treated so that it blocks, e.g., absorbs, the first wavelength of light. For example, the adhesive layer 112 can include a material, e.g., a light-activated dye, that changes absorption to the first wavelength in response to being irradiated by the second wavelength of light. In particular the adhesive layer 112 can be treated so that the portion 112 extends partially, but not entirely, through the thickness of the adhesive layer 112. As a result, a portion 112b of the adhesive layer between the treated portion 112a and the micro-device 110 will be less exposed to the first wavelength of light in the subsequent illumination step. Consequently, the portion 112b can retain stronger adherence to the micro-devices than the adhesive layer 420.

Another technique to control which micro-devices are transferred from a donor substrate to a transfer substrate, or from a transfer substrate to a destination substrate, is to deposit a masking layer on a back side of the appropriate substrate, e.g., the donor substrate, to block illumination of a corresponding region of the adhesive layer during the illumination step. Such a process is illustrated in FIGS. 25-29.

Figure 25:
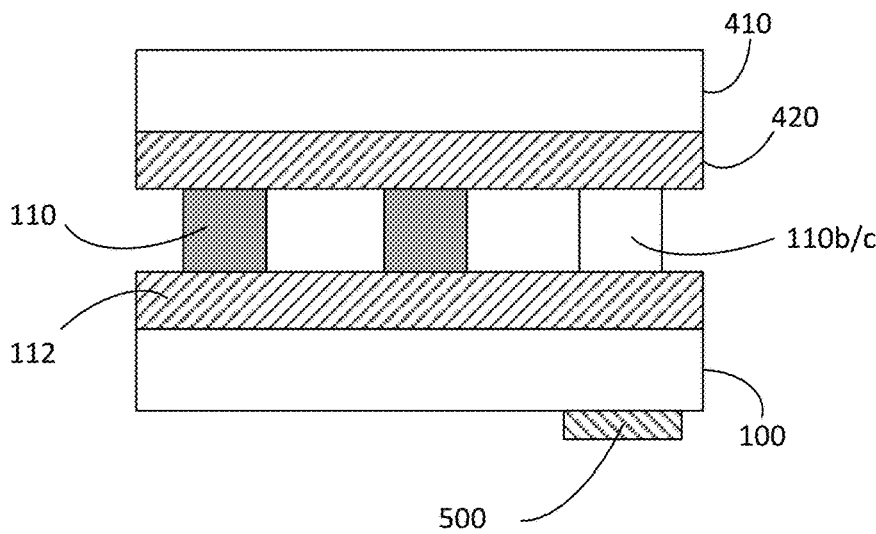
FIG. 25 is a schematic cross-sectional side view illustrating formation of a masking layer on a substrate.

As shown in FIG. 25, a masking layer 500 is selectively deposited onto the side of the donor substrate 100 opposite the adhesive layer 112. The masking layer 500 is deposited at positions corresponding to the micro-devices 110b/110c that will not be transferred.

Figure 26:
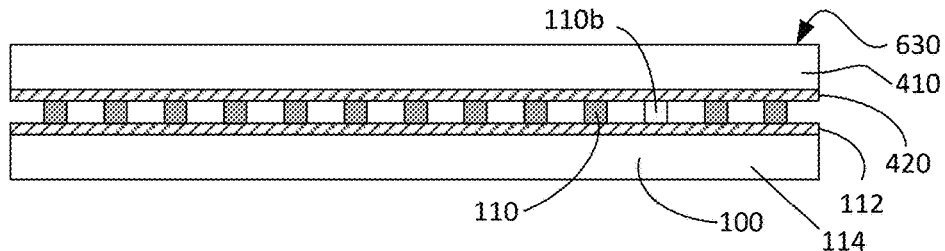
FIGS. 26-29 are schematic cross-sectional side views illustrating another method of transferring multiple micro-devices from a donor substrate to a transfer substrate.

As shown in FIG. 26, the transfer substrate 410 of the transfer device 630 is positioned adjacent the donor substrate 100 so that the micro-devices 110 adhere to the adhesive layer 420 on the transfer substrate 410.

Figure 27:
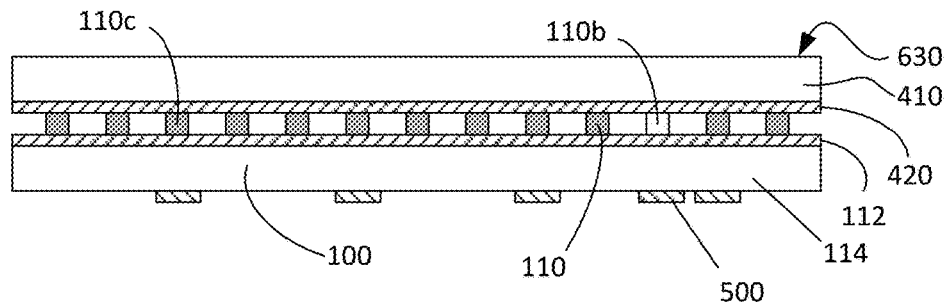

As shown in FIG. 27, a masking layer 500 is deposited to form at least one masked area on the side of donor substrate 100 opposite the adhesive layer 112. The masking layer 500 can be deposited by forming a layer across all of the donor substrate 100 and then selective removal. For example, a metal layer can be deposited by a process such as CVD and then removed by etching with appropriate photoresists. Or a positive or negative photoresist that blocks the wavelength of light used in the illumination step can be deposited, e.g., by spin coating. Then the layer of photoresist can be illuminated, e.g., by a laser scanning system or a digital micro-mirror device (DMD) array, and developed to remove the appropriate portion of the photoresist. Alternatively, the masking layer 500 can be selectively deposited. For example, droplets of a material that is opaque to the wavelength of light used in the illumination step can be ejected onto selected regions, e.g., by an inkjet printer.

Figure 28:
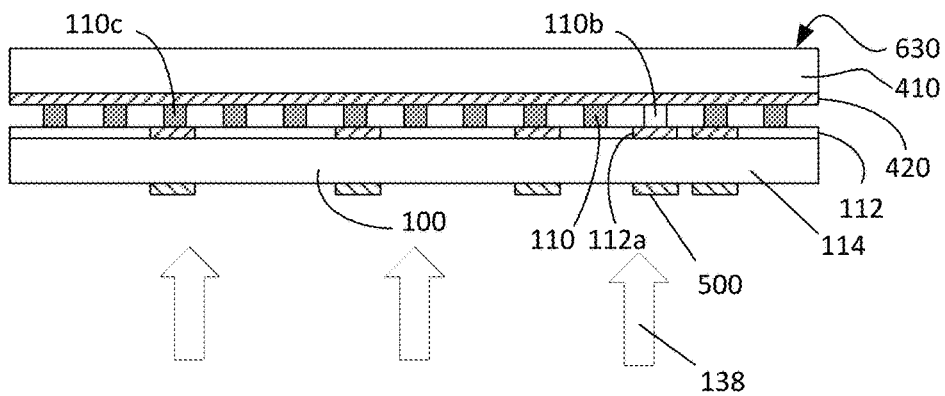

As shown in FIG. 28, light 138 can be directed from the backside of the donor substrate 100 and through the donor substrate 100 to neutralize the adhesive layer 112. However, the light 138 is blocked by masking layer 500 so that each corresponding region 112a is not exposed (or is less exposed) and thus remains adhesive.

In some implementations, the entire back side of the donor substrate 100 is illuminated. In this case, the light 138 can be from a generally wide area collimated light source, e.g., a lamp with appropriate lenses. Alternatively, the light can irradiate selected regions. In this case, the light 138 can be from, e.g., a laser scanning system or a digital micro-mirror device (DMD) array. In either case, the masked region(s) 112a of the adhesive layer corresponding to the mask 500 remain adhesive. In contrast, other areas, e.g., the remainder of the adhesive layer 112, are neutralized.

Figure 29:
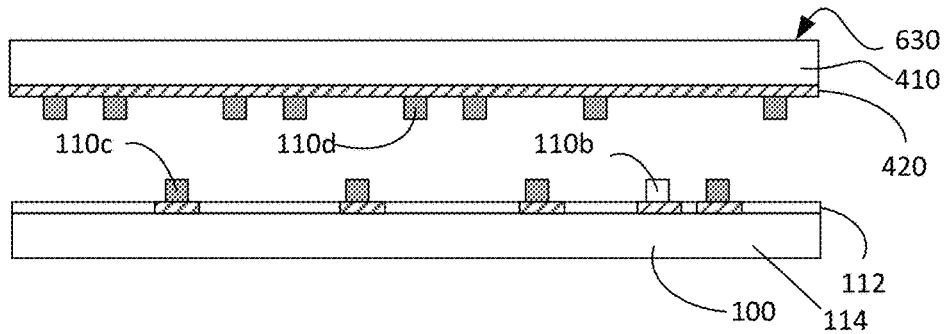

Then, as shown in FIG. 29, when the donor substrate 100 and the transfer substrate 410 are separated, the micro-devices 110b and/or 110c corresponding to the areas covered by the mask 500 remain on the donor substrate 100, whereas the rest of the micro-devices 110d are transferred to the transfer substrate 410.

Although FIGS. 19-23 and FIGS. 25-29 illustrate the transfer from the donor substrate to the transfer substrate, similar processes can be used to transfer micro-devices from the transfer substrate to the destination substrate. In particular, in either of the implementations discussed above, the transfer substrate 410 and adhesive layer 420 can be substituted for the donor substrate 100 and adhesive layer 112 respectively, and the destination substrate 200 can be substituted for the transfer substrate 410 and adhesive layer 420.

It should be understood that while a method of surface mounting a single micro device has been described above, the method can include more than one micro device.

The controller can be implemented in digital electronic circuitry, or in computer software, firmware, or hardware, or in combinations of them. The controller can include one or more computer program products, i.e., one or more computer programs tangibly embodied in an information carrier, e.g., in a non-transitory machine readable storage medium or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a standalone program or as a module, component, subroutine, or other unit suitable for use in a computing environment. A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Terms of positioning, such as vertical and lateral, have been used. However, it should be understood that such terms refer to relative positioning, not absolute positioning with respect to gravity. For example, laterally is a direction parallel to a substrate surface, whereas vertically is a direction normal to the substrate surface.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. An apparatus for transferring micro-devices, the apparatus comprising:
    a first body having a first surface to receive a first adhesive layer;
    a second body having a second surface to receive a second adhesive layer;
    one or more actuators configured to provide relative motion between the first body and the second body;
    a first illumination system configured to selectively expose the first adhesive layer to a light having a first wavelength; and
    a second illumination system configured to expose the first adhesive layer to a light having a different second wavelength; and
    a controller configured to
        cause the one or more actuators to create relative motion such that a plurality of micro-devices attached to the first body by the first adhesive layer contact the second adhesive layer,
        cause the first illumination system to selectively expose the first adhesive layer to create a treated portion corresponding to one or more micro-devices from the plurality of micro-devices and an untreated portion corresponding to one or more micro-devices from the plurality of micro-devices,
        cause the second illumination system to expose the first adhesive layer in a region that overlaps at least some of the treated portion and at least some of the untreated portion to create a neutralized portion while the at least some of the treated portion retains adhesiveness; and
        cause the one or more actuators to create relative motion such that the first body and the second body are moved away from each other and one or more micro-devices corresponding to the treated portion of the first adhesive layer remain attached to the first surface and one or more micro-devices corresponding to the neutralized portion are attached to the second surface and are separated from the first surface.

2. The apparatus of claim 1, wherein the first illumination system is configured to generate a light beam having a spot size smaller than a cross-sectional area of one of the micro-devices.

3. The apparatus of claim 1, wherein the first illumination system is configured to generate a light beam having a spot size that spans at least two micro-devices.

4. The apparatus of claim 1, wherein the first illumination system and the second illumination system are positioned to direct the light having the first wavelength and the light having the second wavelength through the first body to the first adhesive layer.

5. The apparatus of claim 1, wherein the second illumination system is configured to expose a region that simultaneously spans all of the plurality of micro-devices.

6. The apparatus of claim 1, wherein the first body comprises a first substrate that is removable from a first support.

7. The apparatus of claim 1, wherein the second body comprises a second substrate that is removable from a second support.

8. The apparatus of claim 1, wherein the one or more actuators comprise a robotic arm operable to move one of the first body or the second body vertically relative to the other of the first body or the second body.

* * * * *

UNITED STATES PATENT AND TRADEMARK OFFICE
CERTIFICATE OF CORRECTION

| | | |
|---|---|---|
| PATENT NO. | : 12,176,384 B2 | Page 1 of 1 |
| APPLICATION NO. | : 18/450963 | |
| DATED | : December 24, 2024 | |
| INVENTOR(S) | : Manivannan Thothadri and Arvinder Chadha | |

It is certified that error appears in the above-identified patent and that said Letters Patent is hereby corrected as shown below:

In the Specification

Column 1, Line 12, delete "15/919,226," and insert -- 15/619,226, --.

Signed and Sealed this
Eighteenth Day of March, 2025

Coke Morgan Stewart
*Acting Director of the United States Patent and Trademark Office*